United States Patent [19]

Johnson

[11] 3,745,377

[45] July 10, 1973

[54] PULSE DRIVE CIRCUIT

[75] Inventor: Robert W. Johnson, Bloomington, Minn.

[73] Assignee: Control Data Corporation, Minneapolis, Minn.

[22] Filed: Dec. 22, 1971

[21] Appl. No.: 210,844

[52] U.S. Cl........... 307/252 J, 307/240, 307/252 K, 307/270, 307/284

[51] Int. Cl. .......................................... H03k 17/72

[58] Field of Search ...................... 307/252 J, 252 K, 307/252 M, 252 W, 252 H, 240, 241, 282, 243, 262, 268, 270, 284, 305; 323/22 SC, 8; 328/60, 61, 57; 321/34, 44, 49

[56] References Cited

UNITED STATES PATENTS

| | | | |
|---|---|---|---|
| 3,439,189 | 4/1969 | Petry | 307/252 J |
| 3,243,796 | 3/1966 | Harmon et al. | 307/252 J X |
| 3,194,987 | 7/1965 | Mandel | 307/252 J |
| 3,371,227 | 2/1968 | Sylvan | 307/252 J |
| 3,331,992 | 7/1967 | Walker | 307/252 J X |
| 3,564,282 | 2/1971 | Vogelsberg | 307/252 J X |
| 3,334,292 | 8/1967 | King et al. | 307/282 X |
| 3,067,378 | 12/1962 | Paynter | 307/282 X |
| 3,299,288 | 1/1967 | McDowell et al. | 307/252 J X |
| 3,370,238 | 2/1968 | Lampa | 328/56 |
| 3,621,287 | 11/1971 | Peterson | 307/252 J X |

FOREIGN PATENTS OR APPLICATIONS

| | | | |
|---|---|---|---|
| 1,276,713 | 9/1968 | Germany | 307/252 J |

OTHER PUBLICATIONS

Jones et al., "Silicon Controlled Rectifiers Inverters"; Digest of Technical Papers, p. 50–51; Defense Telecommun. Establishment.

*Primary Examiner*—John W. Huckert
*Assistant Examiner*—L. N. Anagnos
*Attorney*—Joseph A. Genovese and William J. McGinnis, Jr.

[57] ABSTRACT

A pulse generator driver supply in which a pair of oppositely phased SCR's are connected to primary terminations of a transformer. The SCR's are individually turned on to form opposite halves of a bi-polar pulse cycle by transistors unclamping the firing voltage to the gate of the SCR to be turned on. A plurality of diodes are in series with the paralleled cathodes of the SCR's to cause shut off, terminating the respective half cycles of pulses, as a control transistor is turned on between the anode of the respective SCR and ground, biasing the individual SCR to cutoff at the same time as the gate firing voltage is again clamped.

8 Claims, 1 Drawing Figure

PATENTED JUL 10 1973 3,745,377
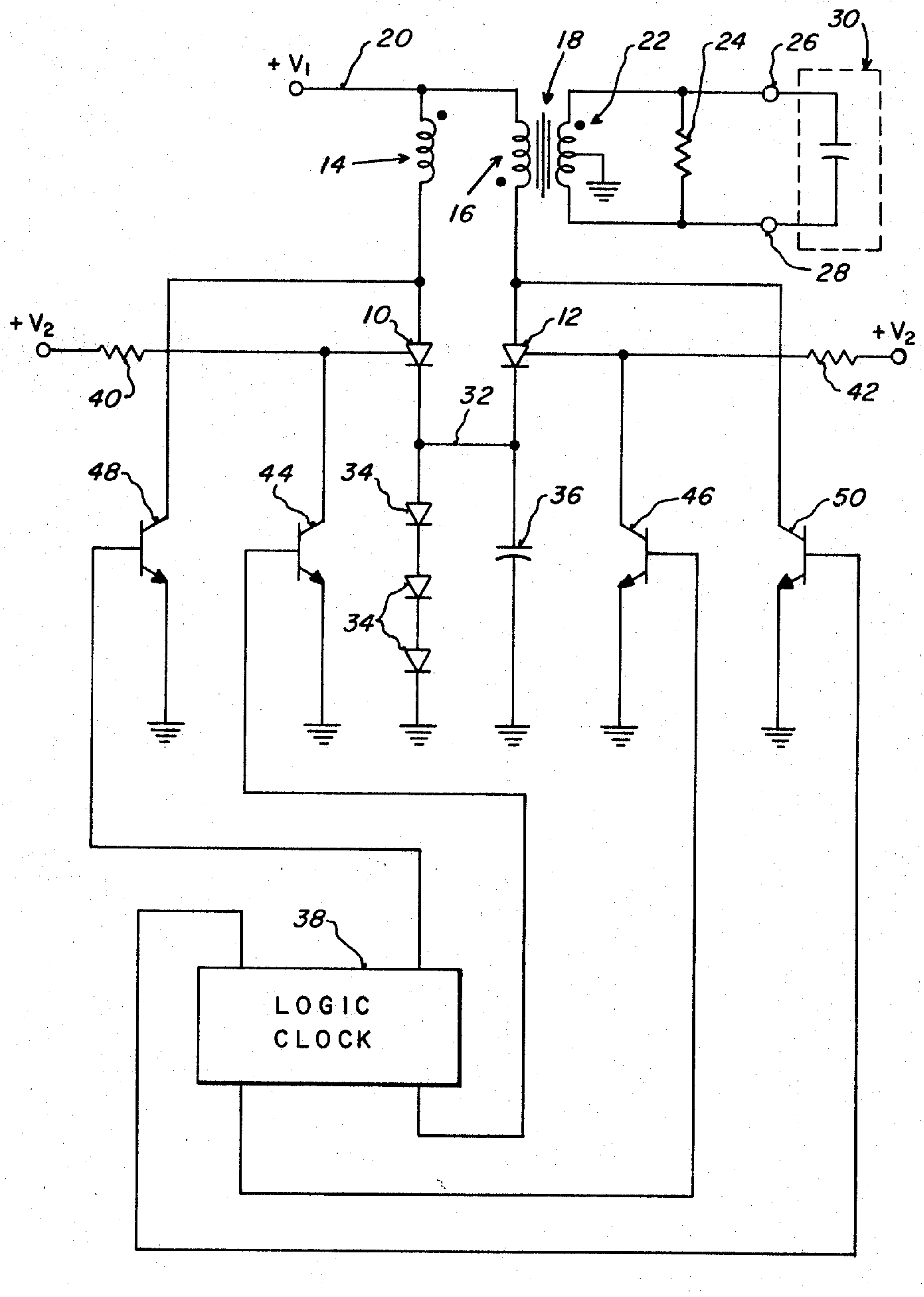

PULSE DRIVE CIRCUIT

BACKGROUND OF THE INVENTION

This invention relates to electronic pulse driver circuits in general. Such a pulse driver may be used, for example, for gaseous discharge display devices, such as may be used for rapid readout of information from a computer.

U.S. Pat. No. 3,573,542 shows one form of drive circuit for controlling a gaseous discharge display device in the form of a panel. One of the characteristics of such display panels is that they have a "memory" as to the condition of each individual cell in the device.

The cells are defined by the intersections between an array of vertically oriented conductors insulated from the gas and disposed on one wall of the panel and a second array of horizontally oriented conductors disposed on the opposite wall of the panel with the gas between the arrays. It is obvious that the designation of one horizontal conductor and one vertical conductor will uniquely define an individual cell in the panel. Each of the cells may be placed in an "on" state, represented by a periodic discharge in the gas providing apparently continuous illumination, or in an "off" state in which the cell remains dark.

Voltage pulses applied between the conductor arrays at frequencies on the order of several kilohertz are used to drive the panels. Relatively high peak voltages, $^{v}$write, are required to initiate the lighted condition in a previously unlighted cell. Lesser peak voltages, $^{v}$sustain, are required for maintaining a cell in the lighted condition without initiating a discharge in a previously unlit cell. Drive with still lower voltage peaks, $^{v}$erase, will cause a lighted cell to be extinguished. Summarizing, the peak voltage relationships are $^{v}$write>$^{v}$sustain>$^{v}$erase. Cells not having their "on" or "off" states changed are driven at all times by a drive system characterized by $^{v}$sustain, and hence the panels will indefinitely "remember" the states of the individual cells in the array.

Since all of the cells in a panel will be driven most of the time in the sustained or memory mode, the generator producing the sustain voltage represents one of the basic items of hardware associated with a gaseous discharge display panel. One of the requirements of the drive waveform used in the sustain mode is that it have a very short rise time. This is because a lighted cell, in order to remain lighted must develop, during each discharge, a substantial capacitive charge of opposite polarity with respect to the sustain pulse, the charge persisting until the oppositely polarized portion of the sustain cycle occurs. A voltage equal to the sustain pulse plus the capacitive charge is needed to trigger a new discharge. If the risetime of the waveform is too long, an "immature" discharge occurs, causing illumination but insufficient to build up a sufficient capacitive charge to allow another discharge when combined with the next oppositely polarized portion of the sustain waveform.

Present sustain drivers employ power transistors in the sustain driver driven by an appropriate pulse generator. Circuits for generating pulse waveforms of the required characteristics using transistors are relatively expensive. Consequently, it is desired to build a more economical sustain driver.

Generally, a pulse driver circuit of the type disclosed is useful in many applications such as direct current to alternating current or direct current to direct current converters. Because of the cost of power transistors, a circuit, such as is disclosed, replacing power transistors with less expensive SCR's is desirable for a number of functions.

SUMMARY OF THE INVENTION

In the present invention, a pulse driver supply is provided in which a pair of silicon controlled rectifiers (SCR) generates pulses. One of the pair of SCR's initiates one-half of the waveform cycle and the other initiates the other, oppositely polarized, half of the cycle. In the form of the invention shown, the pulse driver supply is described in connection with supplying the sustain voltage waveform to a gaseous discharge display device, at a frequency within the range of approximately 30 to 50 kilohertz. This description is not meant to be limiting because the same circuit could as easily be used in converters, for example.

In the embodiment of the invention herein described, the cathodes of the SCR's are connected in parallel and are maintained at a predetermined positive potential with respect to ground to facilitate shutting the SCR's off, as will be described.

The control circuit for each SCR may be identical; and, as described in this embodiment of the invention for each SCR, a first, normally on, transistor is connected from the gate supply voltage of the SCR to ground and the SCR is fired when the transistor is turned off by allowing the gate voltage to then rise to firing potential. A second, normally nonconducting, transistor is connected from the anode of the SCR to ground. When the SCR is conducting and it is to be shut off, the second transistor is turned on. The firing voltage at the gate is also shut off at about the same time. Since the SCR cathode is held at a predetermined potential and the second transistor is connected with ground, the result when the second transistor is turned on, is that the SCR is backbiased and consequently turns off. This operation occurs sequentially with both SCR's to generate the desired pulse train. The SCR's are connected, in the illustrative usage herein described, to oppositely phased primary terminations of a transformer which boosts the voltage to the required level for driving the display device in the sustain mode.

In the driver supply shown, the predetermined potential for the SCR cathodes is provided by a group of three diodes, in series, connected from the SCR cathodes to ground. The diodes are bypassed with a capacitance having a low impedance at the frequencies used.

DESCRIPTION OF THE FIGURE

The single FIGURE is an electrical schematic diagram of a pulse driver circuit according to the present invention.

DESCRIPTION OF THE PREFERRED EMBODIMENT

Referring now to the FIGURE, a pair of silicon controlled rectifiers (SCR) 10 and 12 are connected to oppositely phased, as indicated by the dot symbols, primary terminations 14 and 16 of a transformer generally indicated at 18. A center tapped transformer with the supply voltage on the center tap and the SCR's connected to the legs may be used. The SCR's will ideally have a relatively short turn on time so as to generate pulses with short rise times when the circuit is used with a plasma display device. A direct current source voltage is connected to termination 20 of the transformer 18 so that current for both SCR's passes through the transformer. The transformer has a secondary coil 22 connected to a load resistor 24 and to terminal 26, which in a plasma display device, may be connected to an X-axis array of horizontally directed conductors on one side of a gas discharge display panel and to terminal 28 which may be connected to a Y-axis array of vertically directed conductors on the opposite side of a gas discharge display device. The capacitive load of the illustrative display device is indicated schematically by a capacitor 30. It is appreciated that in actual display systems, there will be additional switching circuitry between the sustain driver and the device, none of which needs to be shown here. Although the display device illustrated provides a capacitive load, other load characteristics, e.g. resistive, will work as well.

The cathodes of the two SCR's are connected together at a junction 32, which is maintained at a predetermined potential. Three diodes 34 are connected in series from the junction 32 to ground which may be referred to as a reference potential. A capacitor 36 is connected between the junction 32 and ground. The diodes 34 have sufficient current carrying capacity so that they can carry the average direct current value of the current flowing through SCR's 10 and 12. The capacitor 36 has a sufficiently large capacity with respect to the frequency of operation of the pulse driver supply so that it maintains an essentially direct current positive predetermined potential, or voltage, at the junction 32, with respect to the reference potential, or ground.

Schematically indicated is an electronic box 38 containing the circuits, including, for example, a frequency generator or clock and related circuitry for turning on and off the control transistors regulating current flow in the SCR's 10 and 12, as will be described. Firing voltage for the gates of SCR's 10 and 12 is supplied through resistors 40 and 42 respectively from a source voltage. Each SCR has a normally conducting transistor 44 and 46, respectively, connected from the gate to ground. The bases of transistors 44 and 46 are connected to the control circuitry in box 38. Each SCR is associated with a transistor, 48 and 50 respectively, which is connected from the anode thereof to ground. The bases of transistors 48 and 50 are connected to the control circuitry in box 38. In operation each SCR is responsible for one half cycle of the pulse waveform. The operation of each SCR and its two associated transistors is therefore identical.

Initially, assuming SCR 12 to be in its off, nonconducting state, it is desired to turn on SCR 10. To do this circuitry in box 38 turns transistor 44 from its normally conducting state to a non-conducting state. The normally conducting state of transistor 44 causes the firing voltage supplied for the gate of SCR 10 to drop across resistor 40. When the transistor 44 is turned off the firing voltage appears at the gate of SCR 10 causing it to become conducting. The SCR's are chosen so that they have a very short turn on time and are capable of working into an inductive load such as the primary windings of transformer 18. As SCR 10 is turned on a pulse of current travels through the primary of transformer 18 and generates a pulse in the secondary thereof.

It will be apparent that the current passing through SCR 10 also passes through the diodes 34 and a charge is built up on capacitor 36. After a suitable time interval, dependent upon the length of pulse desired, transistor 44 is once more turned on removing the firing voltage from the gate of SCR 10 and normally nonconducting transistor 48 is turned on thereby conducting current around SCR 10 and to ground. Since diodes 34 elevate the cathode potential of SCR 10 with respect to ground, the conducting state of transistor 48 will bring the anode of SCR 10 to a potential below that of the cathode causing the SCR to be back biased and shut off. Consideration of the junction potentials in the transistor 48 and the SCR 10 respectively shows that at least one diode 34 will be needed in the cathode circuit of the SCR to cause this back biasing to occur. It is desirable to have more than one diode 34 to insure proper functioning of the circuit as well as a quick shut off time. In operation, capacitor 36 maintains a direct current level at the junction 32 connecting the SCR's. Circuit operation with respect to SCR 12 is identical to that of SCR 10.

It may be appreciated that, as transistor 48 is turned on bypassing the SCR and the group of diodes 34, there will be a slight additional pulse and additional flow of current in the primary winding 14 of transformer 18 because of the slightly greater potential thereacross with the diodes 34 not in this configuration of the circuit. This secondary pulse is of such small size that it ordinarily need not be considered in circuit design. However, the size of this pulse may be controlled in several ways, the most obvious of which is that the number of diodes 34 not be unnecessarily increased beyond the number required to insure proper back biasing of the SCR. In addition, the effect of this secondary small pulse may be diminished by turning transistor 48 on slowly enough so that there is no abrupt potential difference in the primary winding giving rise to a sharp rapid rise time slope in the secondary pulse generated thereby. Thus, the secondary pulse will not cause problems in sustaining the plasma discharge display device, when used in that specific application.

What is claimed is:

1. A pulse driver supply for driving a load comprising:

at least one SCR having a gate and a pair of power connections, the first of which is connected to said load, means for maintaining the second of said SCR power connections at a predetermined potential with respect to a reference potential, means for applying firing voltage to the gate of said SCR to initiate a pulse, means connected to the first of said SCR power connections and to said reference potential for changing the potential of said connection to a potential relative to that of said predetermined potential such that the SCR is back biased to cutoff, terminating the pulse, control means for said means for applying firing voltage to the gate of said SCR and for said means for changing said first power connection potential, for selectively controlling said SCR to generate pulses.

2. The structure of claim 1 wherein said means for maintaining said second connection at a predetermined potential is comprised of at least one diode in series between said connection and said reference potential.

3. A pulse driver supply for generating a bi-polar pulse for driving a load comprising, a first SCR having a gate and a pair of power connections, one of which is connected to said load, means for maintaining one of said power connections of said first SCR at a predetermined potential with respect to a reference potential, means for selectively applying firing voltage to the gate of said first SCR to initiate a pulse, means connected to the other power connection of said first SCR and to said reference potential for selectively changing the potential of said connection to a potential relative to that of said predetermined potential such that said SCR is back biased to cutoff, terminating said pulse, a second SCR having a gate and a pair of power connections one of which is connected to said load, means for maintaining one of said power connections of said second SCR at a predetermined potential with respect to a reference potential, means for selectively applying firing voltage to the gate of said second SCR to initiate a pulse of opposite polarity with respect to the pulse generated by said first SCR, means connected to the other power connection of said second SCR and to said reference potential for selectively changing the potential of said connection to a potential relative to that of said predetermined potential such that said SCR is back biased to cutoff, terminating said pulse of opposite polarity with respect to the first pulse, thereby producing a bi-polar pulse cycle.

4. The structure of claim 3 wherein said load is a transformer having a secondary and a pair of primary inputs of opposite phase with respect to one another, and wherein the power connections of said SCR's are an anode and a cathode, the anodes of each SCR being connected to one of the primary inputs of said transformer and the cathode of each SCR being maintained at said predetermined potential.

5. The structure of claim 4 wherein the cathodes of said first and second SCR's are connected together and wherein said means for maintaining said cathodes at a predetermined potential is comprised of at least one diode connected between said cathodes and said reference potential.

6. The structure of claim 5 and further comprising a capacitor, having a low impedance with respect to the pulse frequency, in parallel with said diode.

7. The structure of claim 5 wherein said means for lowering the anode potential of each SCR is comprised of a normally nonconducting transistor connected across said SCR and said diode, said transistor being selectively turned on for backbiasing said SCR.

8. The structure of claim 5 wherein a plurality of diodes are connected in series between said cathodes and said reference potential.

* * * * *